United States Patent
Koo et al.

(10) Patent No.: US 9,597,704 B2
(45) Date of Patent: Mar. 21, 2017

(54) PLASMA BOUNDARY LIMITER UNIT AND APPARATUS FOR TREATING SUBSTRATE

(71) Applicant: Semes Co., Ltd., Cheonan-si, Chungcheongnam-do (KR)

(72) Inventors: Il Gyo Koo, Daegu (KR); Hyun Jong Shim, Seongnam-si (KR)

(73) Assignee: Semes Co., Ltd., Chungcheongnam-do (KR)

( * ) Notice: Subject to any disclaimer, the term of this patent is extended or adjusted under 35 U.S.C. 154(b) by 761 days.

(21) Appl. No.: 13/779,992

(22) Filed: Feb. 28, 2013

(65) Prior Publication Data

US 2013/0220550 A1 Aug. 29, 2013

(30) Foreign Application Priority Data

Feb. 29, 2012 (KR) .................. 10-2012-0021191
May 11, 2012 (KR) .................. 10-2012-0050235

(51) Int. Cl.
*H01J 37/32* (2006.01)
*H01L 21/67* (2006.01)
*B05C 11/00* (2006.01)

(52) U.S. Cl.
CPC ........ *B05C 11/00* (2013.01); *H01J 37/32623* (2013.01); *H01J 37/32633* (2013.01); *H01J 37/32651* (2013.01); *H01L 21/67126* (2013.01)

(58) Field of Classification Search
CPC ................. H01J 37/32623–37/32651
See application file for complete search history.

(56) References Cited

U.S. PATENT DOCUMENTS

| 5,592,581 | A | * | 1/1997 | Okase | C23C 16/46 |
| | | | | | 118/50.1 |
| 5,660,673 | A | * | 8/1997 | Miyoshi | H01J 37/32642 |
| | | | | | 156/345.51 |
| 6,111,225 | A | * | 8/2000 | Ohkase | H01L 21/67109 |
| | | | | | 118/724 |
| 6,889,627 | B1 | * | 5/2005 | Hao | H01L 21/67126 |
| | | | | | 118/715 |
| 2004/0026372 | A1 | * | 2/2004 | Takenaka | C23C 16/4405 |
| | | | | | 216/71 |
| 2008/0271849 | A1 | * | 11/2008 | Benzing | H01J 37/32623 |
| | | | | | 156/345.44 |

(Continued)

FOREIGN PATENT DOCUMENTS

CN 1148105 A 4/1997
CN 1538503 A 10/2004

(Continued)

*Primary Examiner* — Karla Moore
*Assistant Examiner* — Charlee Bennett
(74) *Attorney, Agent, or Firm* — Harness, Dickey & Pierce, P.L.C.

(57) ABSTRACT

Provided is an apparatus for treating a substrate. The apparatus comprises a plasma boundary limiter unit disposed within a process chamber to surround a discharge space defined above a support unit. The plasma boundary limiter unit comprises a plurality of plates disposed along a circumference of the discharge space, and the plurality of plates are spaced apart from each other along the circumference of the discharge space so that a gas within the discharge space flows to the outside of the discharge space through passages provided between the adjacent plates.

24 Claims, 16 Drawing Sheets

(56) References Cited

U.S. PATENT DOCUMENTS

2012/0031337 A1\* 2/2012 Shiina .................. C23C 14/325
                                                                                                           118/723 R

FOREIGN PATENT DOCUMENTS

| CN | 1550027 A | 11/2004 |
| --- | --- | --- |
| CN | 1948550 A | 4/2007 |
| CN | 101419904 A | 4/2009 |
| JP | 2000-030896 | 1/2000 |
| JP | 2000030896 A \* | 1/2000 |
| KR | 10-2004-0021620 A | 3/2004 |
| KR | 10-2004-0090932 A | 10/2004 |

\* cited by examiner

PLASMA BOUNDARY LIMITER UNIT AND APPARATUS FOR TREATING SUBSTRATE

CROSS-REFERENCE TO RELATED APPLICATIONS

This U.S. non-provisional patent application claims priority under 35 U.S.C. §119 of Korean Patent Application Nos. 10-2012-0021191, filed on Feb. 29, 2012, and 10-2012-0050235, filed on May 11, 2012, the entire contents of which are hereby incorporated by reference.

BACKGROUND OF THE INVENTION

The present invention disclosed herein relates to an apparatus for treating a substrate, and more particularly, to an apparatus for treating a substrate by using plasma and a plasma boundary limiter unit used therein.

In general, semiconductor manufacturing processes may be classified into a variety of processes such as a deposition process, a photolithography process, an etching process, a polishing process, and a cleaning process. Among these processes, the deposition process or the etching process treats a substrate by using plasma. A portion of a substrate treatment apparatus using plasma may include a confinement ring that confines plasma so that the plasma within a process chamber stays in a vertical upper space of a wafer during the process.

Generally, a confinement ring is disposed to surround a vertical upper space of a substrate. Also, the confinement ring includes an integrated body having a circular ring shape. The confinement ring may be provided in plurality. Here, the plurality of confinement rings are vertically spaced apart from each other. A distance between the confinement rings is relatively narrow to prevent plasma from leaking therebetween. However, in the case where the confinement rings having the above-described structure are used, a plasma leakage prevention effect is not high. Also, when the confinement rings having the above-described structure are used, it may be difficult to control plasma density for each region in inner regions of the confinement rings.

Also, the confinement rings interfere with a moving path of a substrate when the substrate is loaded into or unloaded from the process chamber. Thus, the confinement rings move to a standby position at which the confinement rings do not interfere with the moving path of the substrate when the substrate is loaded into or unloaded from the process chamber by a ring driver. Thus, since the confinement rings move to the standby position before or after an opening for loading or unloading the substrate is opened, a large number of processes is needed. Also, since the ring driver for moving the confinement rings is provided, the apparatus may be complicated in structure. Also, since the ring driver vertically moves all of the confinement rings, a large load may be applied to the ring driver.

SUMMARY OF THE INVENTION

The present invention provides a plasma boundary limiter unit having a novel structure that is capable of preventing plasma from leaking and a substrate treatment apparatus including the same.

The present invention also provides a plasma boundary limiter unit that is capable of controlling the density of plasma for each region above a substrate and a substrate treatment apparatus including the same.

The present invention also provides a substrate treatment apparatus capable of reducing the number of processes required when a substrate is loaded into or unloaded from a process chamber.

The present invention also provides a substrate treatment apparatus capable of reducing a time required when a substrate is loaded into or unloaded from a process chamber.

The present invention also provides a substrate treatment apparatus capable of reducing the number of parts that are used for moving a confinement ring.

The present invention also provides a substrate treatment apparatus and method capable of reducing a load applied when a confinement ring moves in a vertical direction.

The feature of the present invention is not limited to the aforesaid, but other features not described herein will be clearly understood by those skilled in the art from descriptions below.

Embodiments of the present invention provide apparatuses for treating a substrate, the apparatuses including: a process chamber having an opening through which the substrate is loaded or unloaded, the process chamber including a door assembly for opening or closing the opening; a support unit disposed within the process chamber to support the substrate; a gas supply unit for supplying a process gas into the process chamber; a plasma generation unit for generating plasma from the process gas; and a plasma boundary limiter unit disposed within the process chamber to surround a discharge space defined above the support unit, the plasma boundary limiter unit minimizing the plasma from leaking from the discharge space, wherein the plasma boundary limiter unit includes a plurality of plates disposed along a circumference of the discharge space, and the plurality of plates are spaced apart from each other along the circumference of the discharge space so that a gas within the discharge space flows to the outside of the discharge space through passages provided between the adjacent plates.

In some embodiments, the plasma boundary limiter unit further may include a coupling member for coupling the plurality of plates to each other. The coupling member may be provided as a ring body. The ring body may be disposed on upper ends of the plates.

In other embodiments, the ring body may include: a first body; and a second body vertically movable with respect to the first body within the process chamber, wherein the first body and the second body may be combined with each other to form a ring shape.

In still other embodiments, the second body may be coupled to the door assembly to vertically move together with the door assembly.

In even other embodiments, the apparatuses may further include a body driver for vertically driving the second body.

In yet other embodiments, the plates may have the same distance therebetween.

In further embodiments, the plates may have different thickness in a vertical direction so that the passages have different widths in the vertical direction. For example, each of the passages may have a lower width less than an upper width thereof.

In still further embodiments, the first body and the second body may be combined with each other to form a circular ring shape, and a length of a side parallel to a radius direction of the ring body of each of the plates may be longer than that of a side perpendicular to the radius direction of the ring body.

In even further embodiments, the first body and the second body may be combined with each other to form a circular ring shape, and the plates may have the same width in a length direction thereof so that a distance between the plates disposed along a radius direction of the ring body is gradually widened toward the outside of the discharge space.

In yet further embodiments, the first body and the second body may be combined with each other to form a circular ring shape, and each of the plates may have a width gradually increasing in a length direction thereof toward the outside of the discharge space so that the plates disposed along a radius direction of the ring body have the same distance therebetween.

In much further embodiments, the plates disposed along a length direction of the ring body may have different distances therebetween.

In still much further embodiments, lower ends of the plates may be disposed adjacent to an upper end of the support unit.

In even much further embodiments, lower ends of the plates may be disposed under an upper end of the support unit.

In yet much further embodiments, each of the plates may be bent in a direction away from the discharge space.

In yet much further embodiments, each of the plates may be vertically bent.

In yet much further embodiments, the coupling member may be coupled to the door assembly to vertically move together with the door assembly.

In yet much further embodiments, the door assembly may include: an outer door disposed outside the process chamber; an inner door disposed inside the process chamber to face the outer door, the inner door being coupled to the coupling member; and a connection plate connecting the outer door to the inner door, wherein the outer door may be vertically driven by a door driver.

In yet much further embodiments, the plasma boundary limiter unit may be formed of a conductive material, and the plasma boundary limiter unit may be in contact with an upper electrode so that the plasma boundary limiter unit is electrically connected to the upper electrode.

Embodiments of the present invention provide plasma boundary limiter units that are used for minimizing leakage of plasma from a discharge space to the outside in an apparatus for treating a substrate by using the plasma, the plasma boundary limiter units including: a plurality of plates disposed along a circumference of the discharge space, wherein the plurality of plates are spaced apart from each other along the circumference of the discharge space so that a gas within the discharge space flows to the outside of the discharge space through passages provided between the adjacent plates.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Hereinafter, a substrate treating apparatus according to exemplary embodiments of the present invention will be described in detail with reference to the accompanying drawings. In description of the present invention, detailed descriptions related to well-known functions or configurations will be ruled out in order not to unnecessarily obscure subject matters of the present invention.

Figure 1:
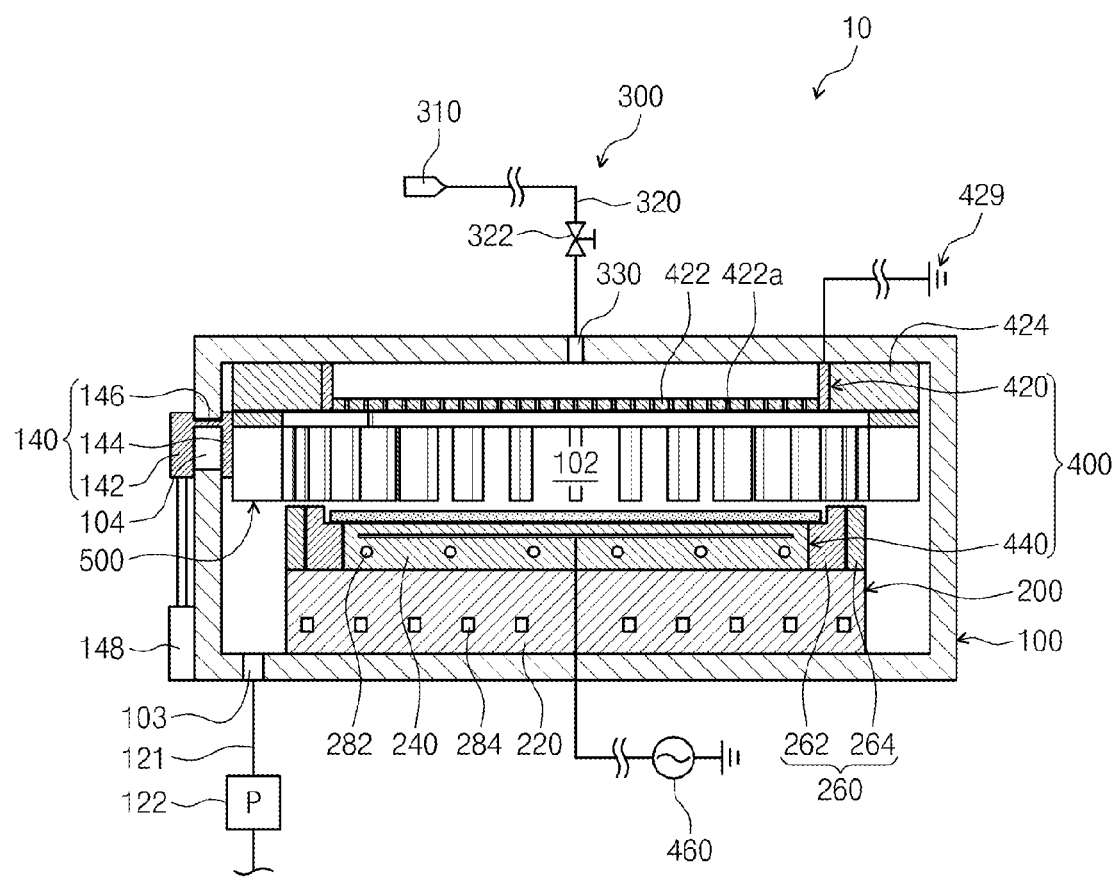
FIG. 1 is a cross-sectional view of a substrate treatment apparatus according to an embodiment of the present invention.

FIG. 1 is a view of a substrate processing apparatus 10 according to an embodiment of the present invention. The substrate treatment apparatus 10 treats a substrate W by using plasma. In the current embodiment of the present invention, an apparatus for treating a substrate W by using plasma will be described as an example. However, technical features of the present invention are not limited thereto. For example, the technical features of the present invention may be applied to various kinds of apparatuses which are capable of treating the substrate W by using plasma.

Referring to FIG. 1, the substrate treatment apparatus 10 includes a process chamber 100, a support unit 200, a gas supply unit 300, a plasma generation unit 400, and a plasma boundary limiter unit 500.

The process chamber 100 provides a space in which a process is performed. An exhaust hole 103 is defined in the bottom of the process chamber 100. The exhaust hole 103 is connected to an exhaust line 121 in which a pump 122 is mounted. Reaction byproducts generated during the process and gases staying in the process chamber 100 may be exhausted to the outside through the exhaust line 121. Also, the inner space of the process chamber 100 is decompressed to a predetermined pressure through the exhausting process. The exhaust hole 103 is defined in a position that directly communicates with an outer space of the plasma boundary limiter unit 500 (that will be described later) in the process chamber 100. According to an embodiment, the exhaust hole 103 may be defined in a position that disposed directly below the plasma boundary limiter unit 500.

An opening 104 is defined in a sidewall of the process chamber 100. The opening 104 serves as a passage through which a substrate (see reference symbol W of FIG. 6) is loaded into or unloaded from the process chamber 100. The opening 104 is opened or closed by a door assembly 140. According to an embodiment, the door assembly 140 includes an outer door 142, an inner door 144, and a connection plate 146. The outer door 142 is disposed on an outer wall of the process chamber 100. The inner door 144 is disposed on an inner wall of the process chamber 100. The outer door 142 and the inner door 144 are fixedly coupled to each other by the connection plate 146. The connection plate 146 extends from the side of the process chamber 100 to the outside through the opening 104. A door driver 148 vertically moves the outer door 142. The door driver 148 may include a hydropneumatic cylinder or a motor.

The support unit 200 is disposed in a lower region within the process chamber 100. The support unit 200 supports the substrate W by using an electrostatic force. Alternatively, the support unit 200 may support the substrate W through various methods such as mechanical clamping.

The support unit 200 includes a base 220, an electrostatic chuck 240, and a ring assembly 260. The electrostatic chuck 240 supports the substrate W on a top surface thereof by using the electrostatic force thereof. The electrostatic chuck 240 is fixedly coupled to the base 220. The ring assembly 260 surrounds the electrostatic chuck 240. According to an embodiment, the ring assembly 260 includes a focus ring 262 and an insulation ring 264. The focus ring 262 surrounds the electrostatic chuck 240 to concentrate plasma onto the substrate W. The insulation ring 264 surrounds the focus ring 262. Alternatively, the ring assembly 260 may include an edge ring (not shown) that is closely attached to a circumference of the focus ring 262 to prevent a side surface of the electrostatic chuck 240 from being damaged by the plasma. Unlike the above-described structure, the ring assembly 260 may variously vary in structure.

According to an embodiment, the electrostatic chuck 240 may be formed of a ceramic material, and the focus ring 262 may be formed of a silicon material. Also, the insulation ring 264 may be formed of a quartz material. A heating member 282 and a cooling member 284 which maintain the substrate W at a process temperature during the process may be disposed within the electrostatic chuck 240 or the base 220. The heating member 282 may be provided as a heating wire. The cooling member 284 may be provided as a cooling line through which a refrigerant flows. According to an embodiment, the heating member 282 may be disposed in the electrostatic chuck 240, and the cooling member 284 may be disposed in the base 220.

The gas supply unit 300 supplies a process gas into the process chamber 100. The gas supply unit 300 includes a gas storage part 310, a gas supply line 320, and a gas inflow port 330. The gas supply line 320 connects the gas storage part 310 to the gas inflow port 330. The supply line 320 supplies the process gas stored in the gas storage part 310 into the gas inflow port 330. A valve 322 for opening or closing the gas supply line 320 or adjusting a flow amount of a fluid flowing into the gas supply line 320 may be disposed in the gas supply line 320.

The plasma generation unit 400 generates plasma from the process gas that stays in a discharge space 102. The discharge space 102 corresponds to an upper region of the support unit 200 within the process chamber 100. The plasma generation unit 400 may have a capacitive coupled plasma source.

The plasma generation unit 400 includes an upper electrode 420, a lower electrode 440, and a high frequency power source 460. The upper electrode 420 and the lower electrode 440 are vertically disposed to face each other. The upper electrode 420 includes a shower head 422 and a ring member 424. The shower head 422 is disposed to face the electrostatic chuck 240. Also, the shower head 422 may have a diameter greater than that of the electrostatic chuck 240. Holes 422a through which a gas is sprayed are defined in the shower head 422. The ring member 424 surrounds the shower head 422. The ring member 424 may be in contact with the shower head 422 and thus electrically connected to the shower head 422. The ring member 424 may be closely attached to the shower head 422. According to an embodiment, the shower head 422 may be formed of a silicon material. Alternatively, the shower head 422 may be formed of a metal material. The ring member 424 may be formed of the same material as the shower head 422. The lower electrode 440 may be disposed within the electrostatic chuck 240. According to an embodiment, the upper electrode 420 may be grounded 429, and the high frequency power source 460 may be connected to the lower electrode 440. Alternatively, the high frequency power source 460 may be connected to the upper electrode 420, and the lower electrode 440 may be grounded. Alternatively, the high frequency power source 460 may be connected to all of the upper and lower electrodes 420 and 440. According to an embodiment, the high frequency power source 460 may continuously apply power to the upper or lower electrode 420 or 440 or apply power to the upper or lower electrode 420 or 440 in the form of a pulse.

The plasma boundary limiter unit 500 has a ring shape to surround the discharge space 102. The plasma boundary limiter unit 500 prevents plasma from leaking from the discharge space to the outside. The plasma boundary limiter unit 500 includes a first body 520 and a second body 540.

Figure 2:
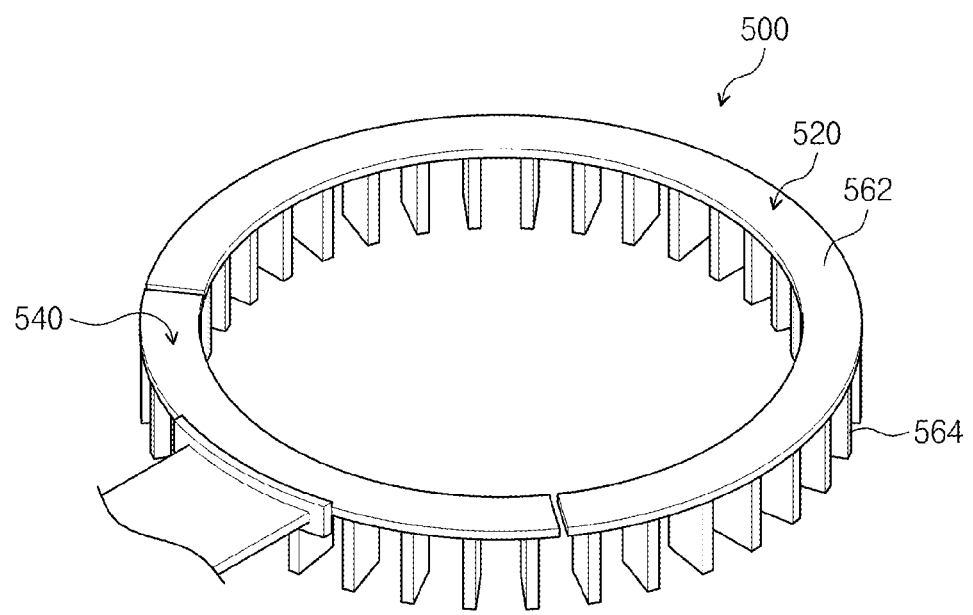
FIGS. 2 and 3 are perspective views illustrating an example of a plasma boundary limiter unit of FIG. 1.
Figure 3:
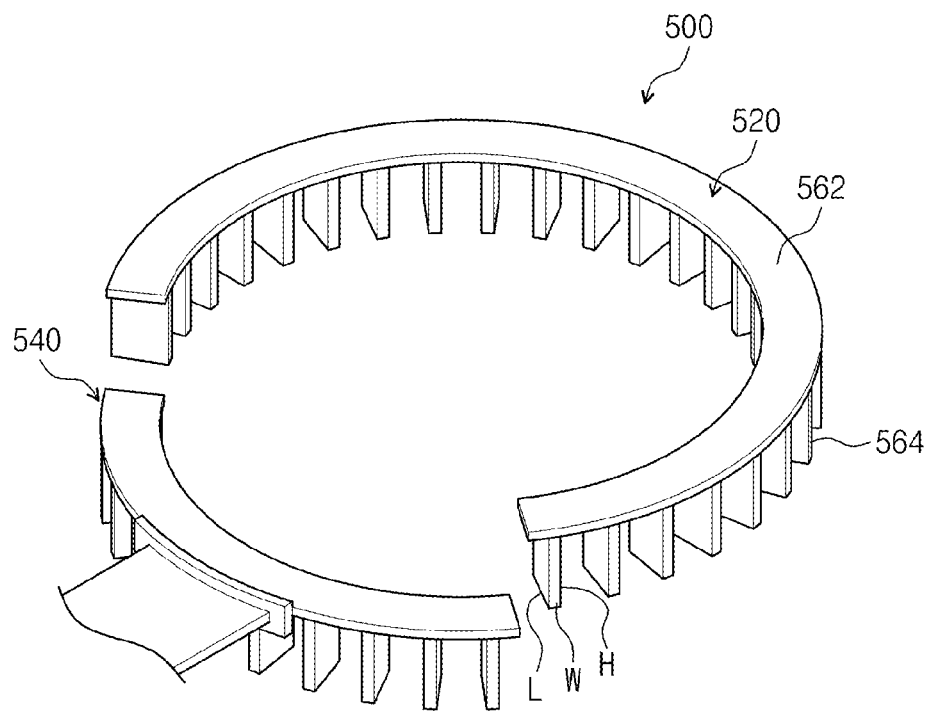

FIGS. 2 and 3 are perspective views illustrating an example of the plasma boundary limiter unit 500. FIG. 2 illustrates a state in which the first and second bodies 520 and 540 are disposed at the same height. FIG. 3 illustrates a state in which the first and second bodies 520 and 540 are disposed at heights different from each other. Referring to FIGS. 2 and 3, the first and second bodies 520 and 540 are combined with each other to form a ring shape. In a case where the substrate W is a semiconductor wafer having a circular plate shape, the first and second bodies 520 and 540 may be combined with each other to form a circular ring shape. The second body 540 is disposed in a region within the process chamber 100 to face the opening through which the substrate W is loaded or unloaded. Each of the first and second bodies 520 and 540 may have an arc shape. The first body 520 may have a central angle greater than that of the second body 540.

Each of the first and second bodies 520 and 540 includes a ring body 562 provided as a portion of a ring and a plurality of plates 564 coupled to the ring body 562. The ring body 562 may be provided as a coupling member that couples the plurality of plates to each other. The ring body 562 has a rod shape rounded in an arc shape. Also, the ring body 562 may be disposed in substantially the same plane. The plates 564 may protrude downward from the bottom of the ring body 562. Each of the plates 564 may have a rectangular thin plate shape. The plate 564 has a length side L, a width side W, and a height side H. The length side L of the plate 564 is substantially parallel to a radius direction of the ring body 562. The width side W of the plate 564 is substantially perpendicular to the radius direction of the ring body 562 when viewed from an upper side. The height side H of the plate 564 is vertically disposed perpendicular to the ring body 562. The length side L of the plate 564 is longer than the width side of the plate 564. The plates 564 may have the same width along a length direction of the plate 564.

The plate 564 is provided in plurality. The plates 564 have the same shape and size. The plates 564 are disposed along a circumference of the discharge space 102. The plates 564 may be spaced apart from each other along the circumference of the discharge space 102. According to an embodiment, the plates 564 may be spaced apart from each other along the radius direction of the ring body 562. A space provided between the adjacent plates 564 is provided as a passage through which a gas within the discharge space 102 is discharged. The plates 564 may have substantially the same distance therebetween. The plates 564 may have a distance therebetween enough to restrain leakage of plasma within the discharge space 102 through the space provided between the plates 564. In the drawings, the distance between the plates may be exaggerated than an actual distance between the plates.

A lower end of the plate 564 may be disposed at the same height as a top surface of the support unit 200 or a height adjacent to the top surface of the support unit 200. For example, the lower end of the plate 564 may be disposed at the same height a top surface of the insulation ring 264 or a height adjacent to the top surface of the top surface of the insulation ring 264. Alternatively, the lower end of the plate 564 may be disposed at a height higher than that of the support unit 200.

According to the embodiment of FIG. 1, the space between the adjacent plates 564 may be opened in a radius direction or downward direction. Thus, a portion of a gas introduced from the discharge space 102 into the space between the plates 564 flows in the radius direction of the ring body 562 and then is discharged to the outside of the plate 564. Also, the other portion of the gas may flow downward in the space between the plates 564 and then be discharged to the outside of the plate 564. Thus, the gas may be further smoothly exhausted when compared to a general confinement ring in which a plurality of rings are spacedly stacked on each other.

Also, the substrate W is loaded into the discharge space 102 within the process chamber 100 through the opening 104 from the outside of the process chamber 100. Then, the substrate W is placed on an elevatable lift pin 170. Thereafter, the lift pin 170 descends to place the substrate W on the support unit 200. The first body 520 and the second body 540 may be coupled to each other to form the ring shape, thereby interfering with a moving path of the substrate W.

In the current embodiment, the second body 540 and the first body 520 may have a variable relative height. For example, the first body 520 is fixedly disposed within the process chamber 100, and the second body 540 is movable in a vertical direction. As shown in FIG. 3, when the substrate W moves through the opening 104, the second body 540 is disposed so that the second body 540 does not interfere with the moving path of the substrate W. Also, as shown in FIG. 2, during the process, the second body 540 is disposed so that the second body 540 is coupled to the first body 520.

Figure 4:
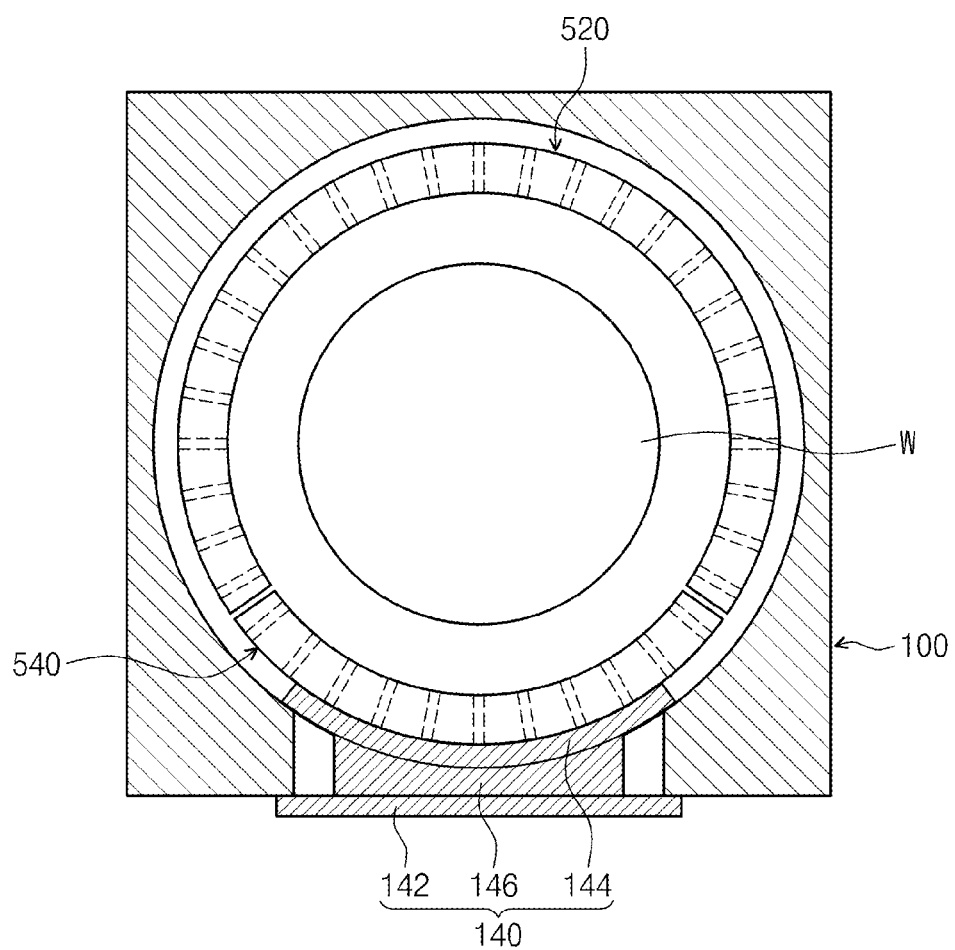
FIG. 4 is a schematic plan view illustrating a coupling state between the plasma boundary limiter unit and a door assembly of FIG. 1.

FIG. 4 is a schematic plan view illustrating a coupling state between the plasma boundary limiter unit 500 and the door assembly 140 of FIG. 1. Referring to FIG. 4, the second body 540 may be fixedly coupled to the door assembly 140 to vertically move together with the door assembly 140. According to an embodiment, the second body 540 may be fixedly coupled to an inner door 144. In this case, the door assembly 140 and the second body 540 may move by the door driver 148 without a separate driver for driving the second body 540. In a state where the opening 104 is closed by the door assembly 140, the second body 540 is disposed at substantially the same height as the first body 520. On the other hand, in a state where the opening 104 is opened by the door assembly 140, the second body 540 is disposed at a height different from that of the first body 520. For example, in the state where the opening 104 is opened, the second body 540 may be disposed at a height less than that of the first body 520.

Also, the plasma boundary limiter unit 500 may be in contact with the upper electrode 420 so that the plasma boundary limiter unit 500 is electrically connected to the upper electrode 420. According to an embodiment, a top surface of the first body 510 may be in contact with a bottom surface of the ring member 424. The plasma boundary limiter unit 500 may be formed of a conductive material. According to an embodiment, the plasma boundary limiter unit 500 may be formed of the same material as the upper electrode 420. For example, the plasma boundary limiter unit 500 may be formed of a silicon or metal material. In this case, the plasma boundary limiter unit 500 may perform a function similar to that of the upper electrode 420. Since the sum of areas of the plasma boundary limiter unit 500 and the upper electrode 420 is greater than an area of the lower electrode 440, plasma may be further concentrated into a region adjacent to the lower electrode 440. Therefore, an etching rate of the substrate W may be improved.

According to another embodiment, the plasma boundary limiter unit 500 may be formed of an insulation material. For example, the plasma boundary limiter unit 500 may be formed of quartz. Also, the plasma boundary limiter unit 500 may be spaced from the upper electrode 420.

Figure 5:
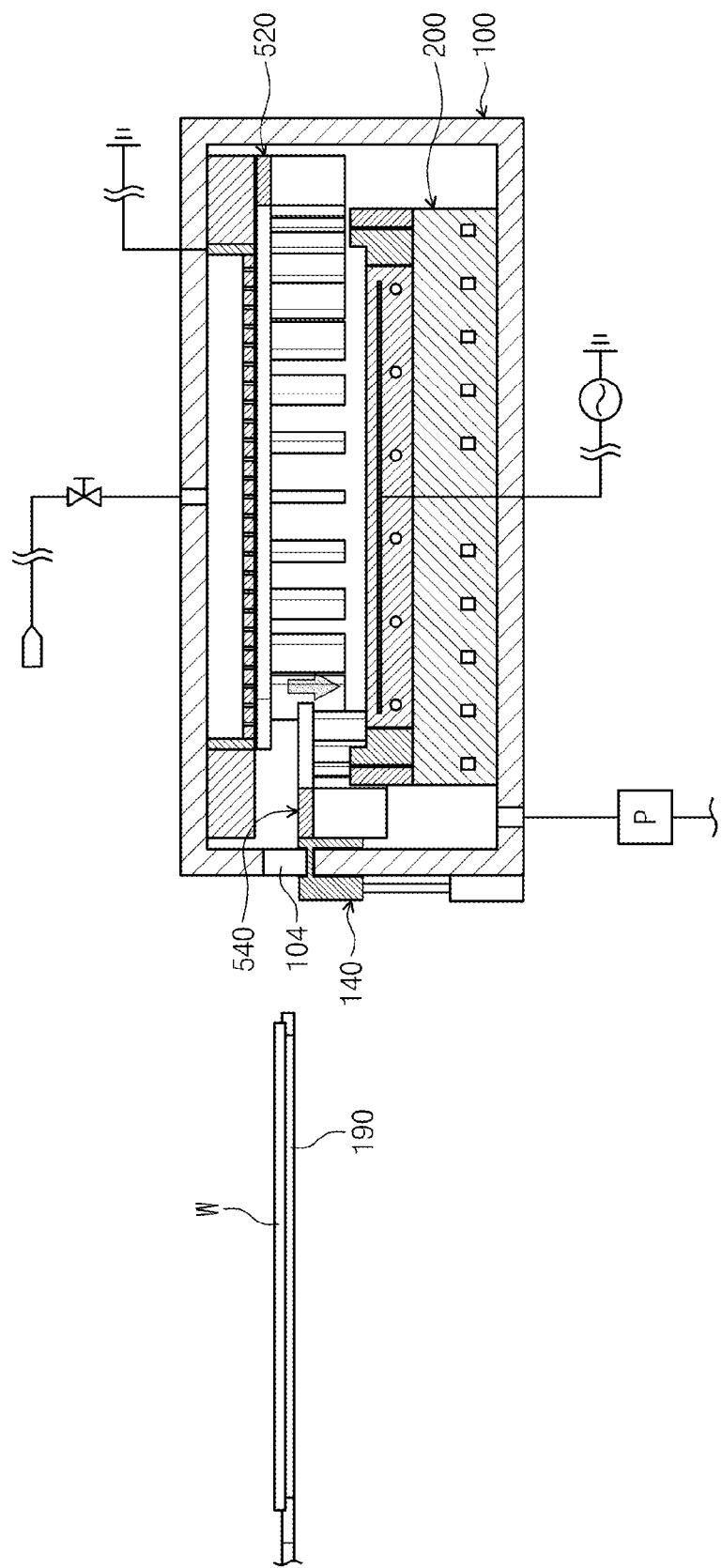
FIGS. 5 to 8 are views sequentially illustrating processes of treating a substrate by using the substrate treatment apparatus of FIG. 1.
Figure 6:
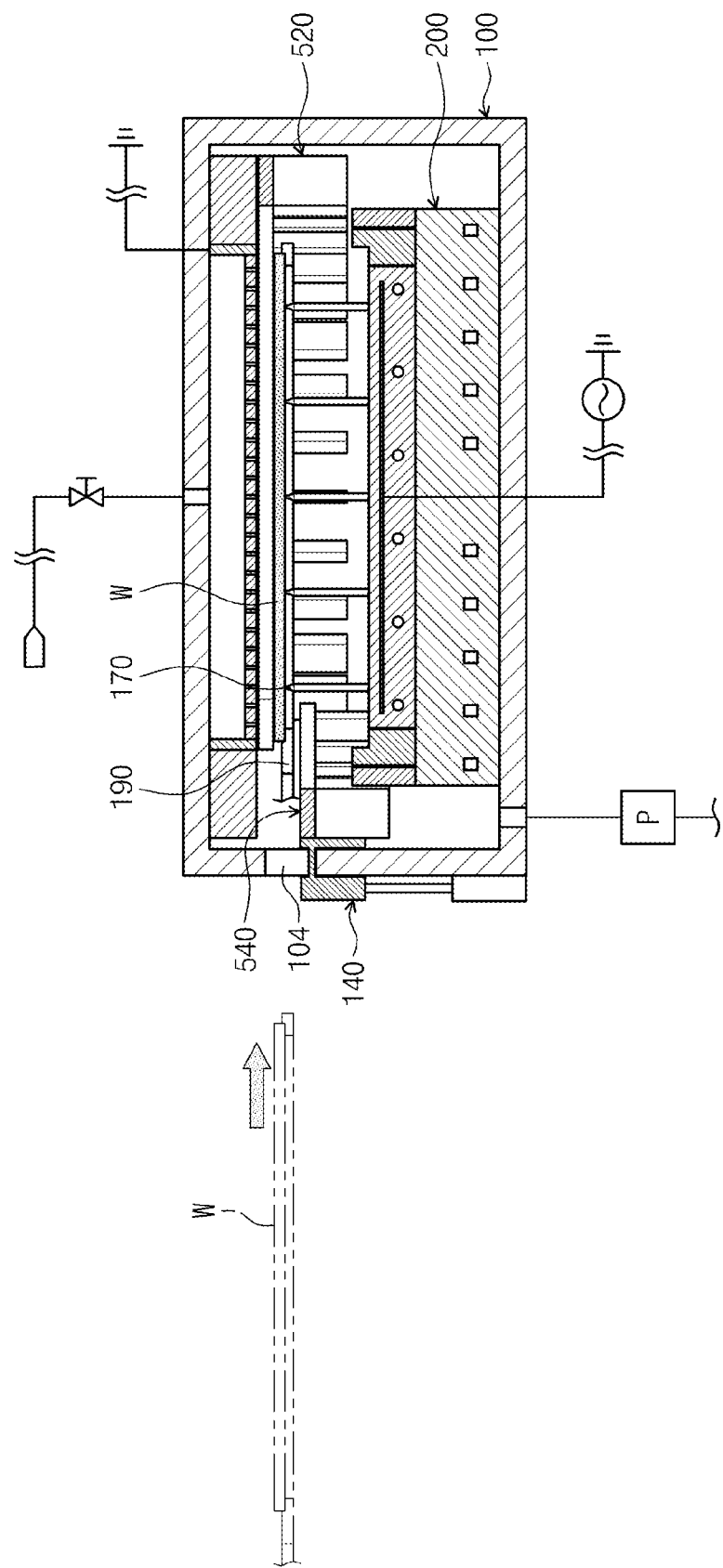
Figure 7:
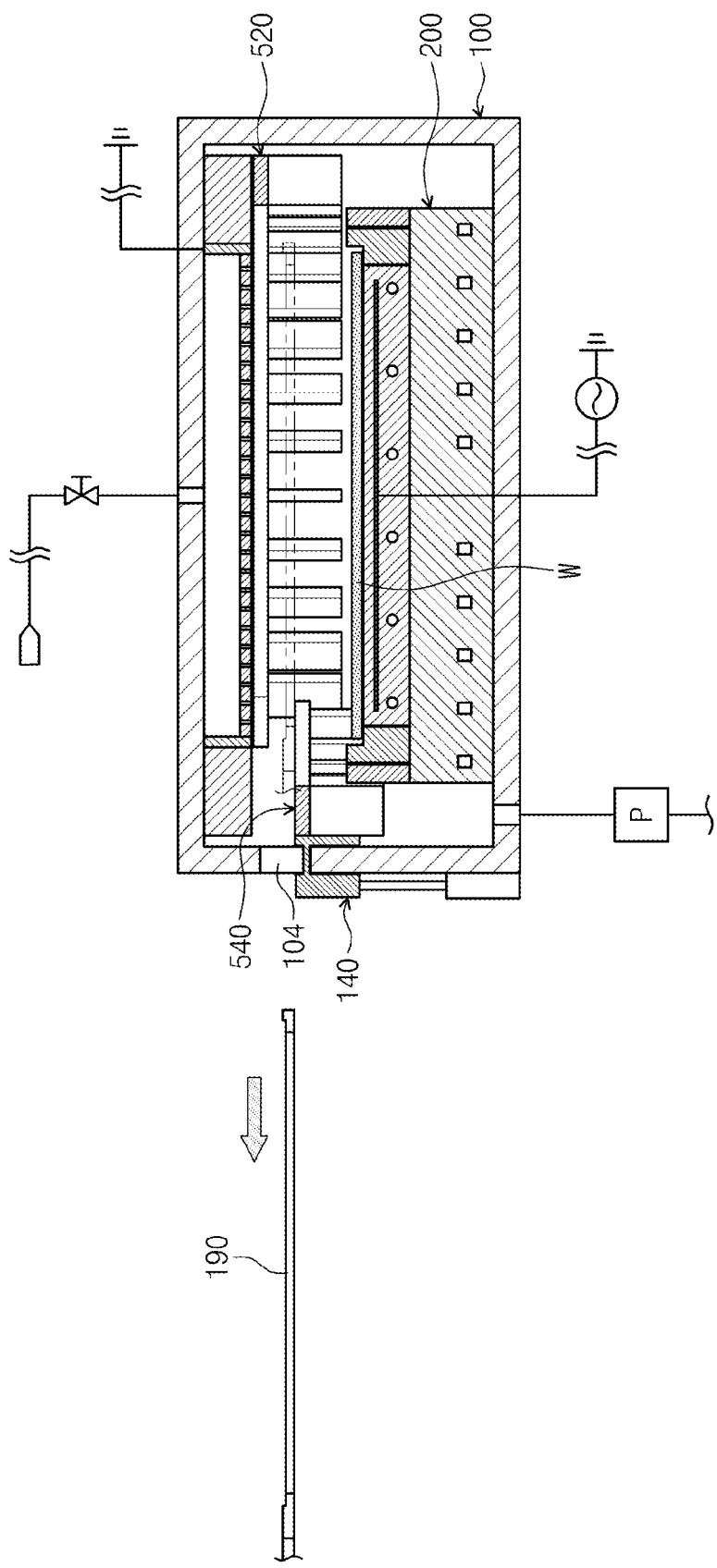
Figure 8:
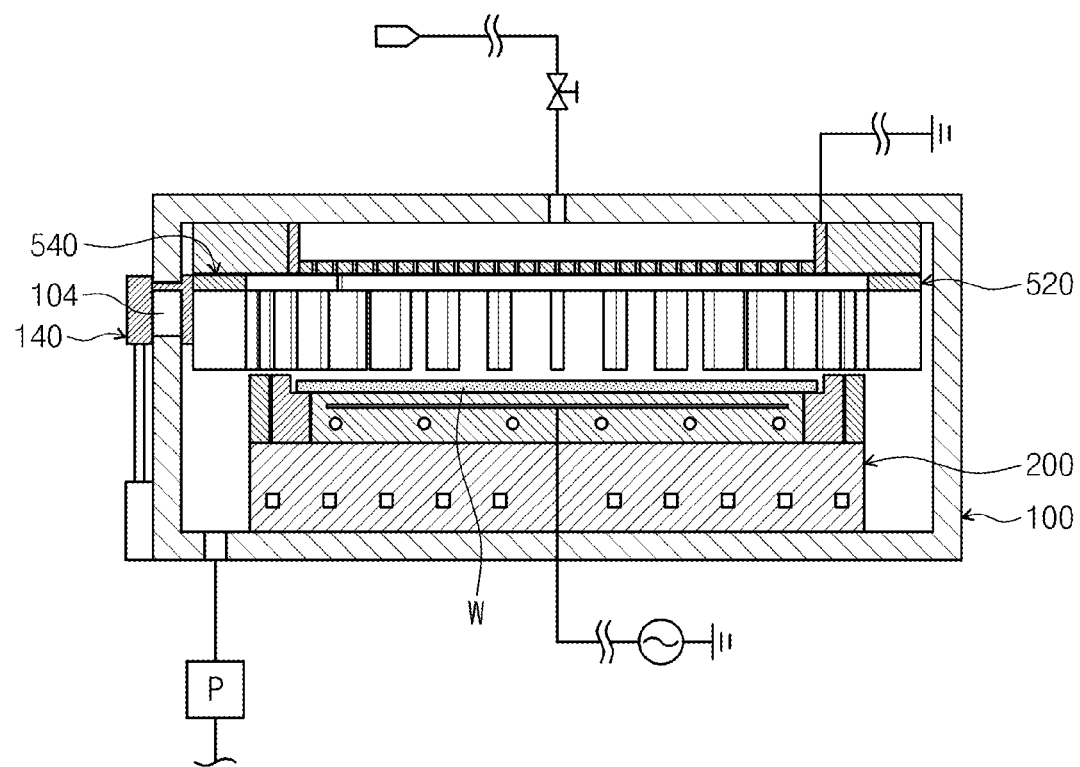

FIGS. 5 to 8 are views sequentially illustrating processes of treating a substrate by using the substrate treatment apparatus 10 of FIG. 1. An example of a method of treating a substrate W in the substrate treatment apparatus 10 of FIG. 1 is as follows. First, as shown in FIG. 5, the door assembly 140 moves downward to open the opening 104 of the process chamber 100, and simultaneously, the second body 540 moves below the first body 520. As shown in FIG. 6, the substrate W is introduced into the discharge space 102 through the opening 104 and the plasma boundary limiter unit 500 by a transfer member 190 for transferring the substrate W. As shown in FIG. 7, the substrate WS is seated on the support unit 200. Then, the transfer member 190 moves to the outside of the process chamber 100. As shown in FIG. 8, the door assembly 140 moves upward to close the opening 104 of the process chamber 100, and simultaneously, the second body 540 is coupled to the first body 520. As a result, the plasma boundary limiter unit 500 may have a ring shape on the whole. In this state, a process gas is supplied into the discharge space 102. Thus, when plasma is generated within the discharge space 102 to treat the substrate W by using the plasma.

According to an embodiment of the present invention, since the plasma boundary limiter unit 500 is divided into the first body 520 and the second body 540, and when the substrate W is loaded or unloaded, only the second body 540 moves vertically, a load applied when the second body 540 moves in a vertical direction may be reduced.

Also, according to an embodiment of the present invention, since the plasma boundary limiter unit 500 is divided into the first body 520 and the second body 540, and the second body 540 is coupled to the door assembly 140 to vertically moves together with the door assembly 140, it may be unnecessary to additionally provide a driver for moving the second body 540.

Also, according to an embodiment of the present invention, since the movement of the second body 540 and the movement of the door assembly 140 are performed at structurally the same time, the substrate treatment apparatus 10 may be more easily controlled.

Also, according to an embodiment of the present invention, since the opening or closing of the opening 104 and the movement of the second body 540 are performed at the same time, the number of processes and a time required from the loading of the substrate W into the process chamber 100 to the unloading of the substrate from the process chamber 100 may be reduced.

Figure 9:
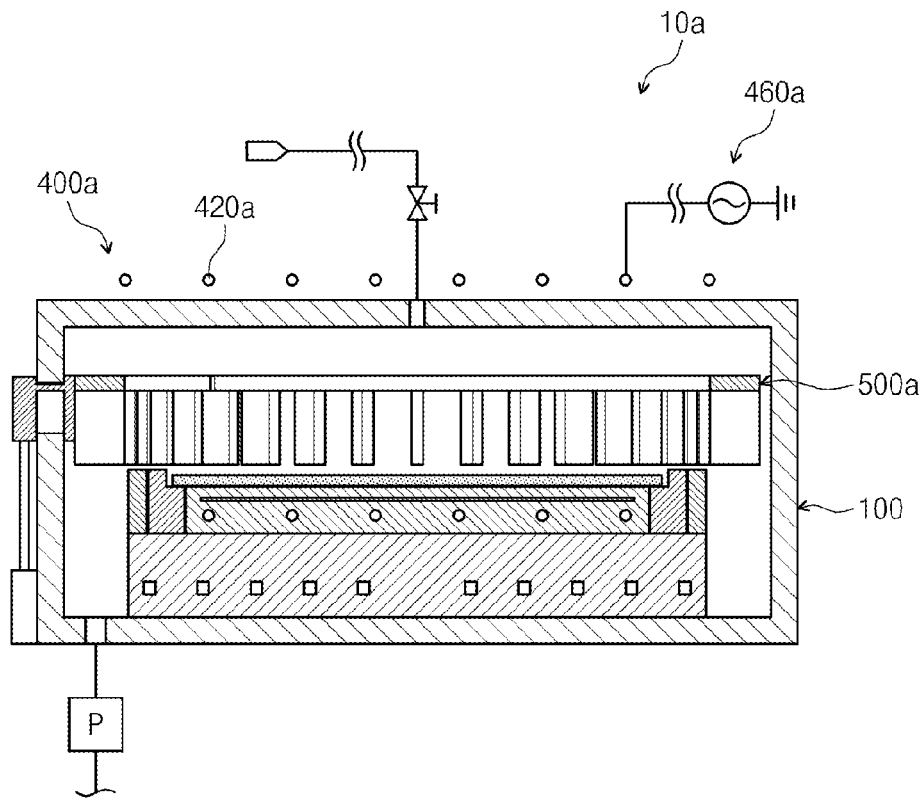
FIGS. 9 to 11 are views illustrating a modified example of the substrate treatment apparatus of FIG. 1.
Figure 10:
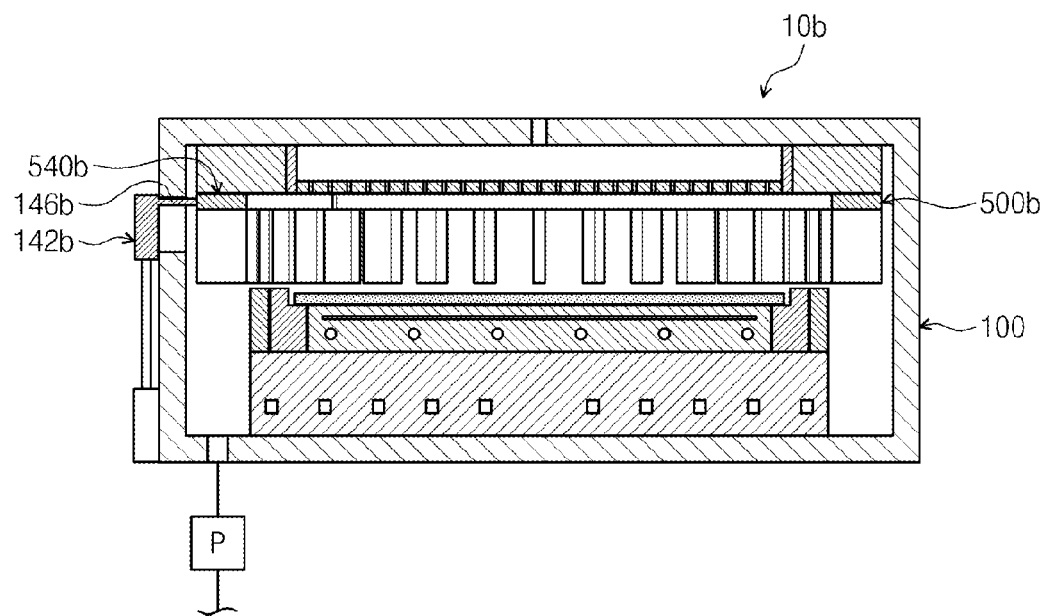
Figure 11:
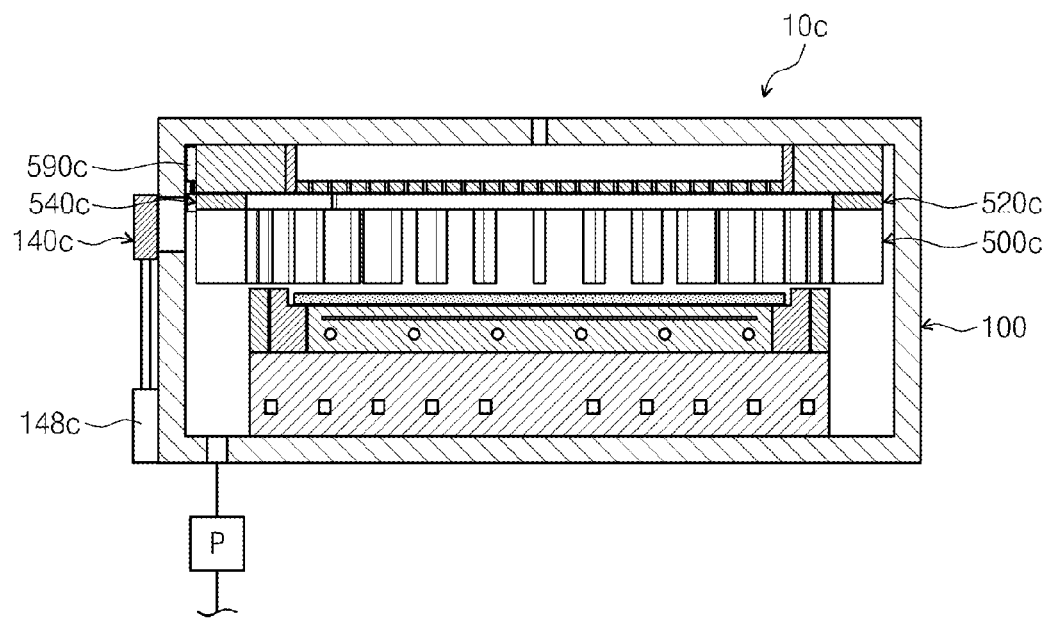

FIGS. 9 to 11 are views illustrating a modified example of the substrate treatment apparatus 10 of FIG. 1. Plasma boundary limiter units 500a, 500b, and 500c in substrate treatment apparatuses 10a, 10b, and 10c of FIGS. 9 to 11 have substantially the same structure as or similar to that of the plasma boundary limiter unit 500 of FIG. 1.

The plasma source 400a in the substrate treatment apparatus 10a of FIG. 9 includes an inductively coupled plasma source. The plasma source 400a includes an antenna 420a disposed outside the process chamber 100a. A high frequency power source 460a may be connected to the antenna 420a. According to an embodiment, the antenna 420a may be disposed above the process chamber 100a.

A door assembly 140b in the substrate treatment apparatus 10b of FIG. 10 may include only an outer door 142b without including an inner door. In this case, a second body 540b may be directly coupled to the outer door 142b by a connection plate 146b.

In the substrate treatment apparatus 10c of FIG. 11, a second body 540c may be separated from a door assembly 140c. The second body 540c may be adjusted in a relative height with respect to the first body 520c by a body driver 590c that is provided independent from a door driver 140c. In this case, since the body driver 590c drives only the second body 540c, but does not drive the whole plasma boundary limiter unit 500c, a load may be less.

FIGS. 12 to 21 are views of plasma boundary limiter units 500d to 500j according to another embodiment of the present invention. The plasma boundary limiter units 500d to 500k and 500m of FIGS. 12 to 21 may be provided in the substrate treatment apparatuses 10, 10a, 10b and 10c of FIGS. 1 and 9 to 11. Also, second bodies 540d to 540j of the plasma boundary limiter units 500d to 500j of FIGS. 12 to 17 may be adjusted in relative height with respect to first bodies 520d to 520j, respectively.

Figure 12:
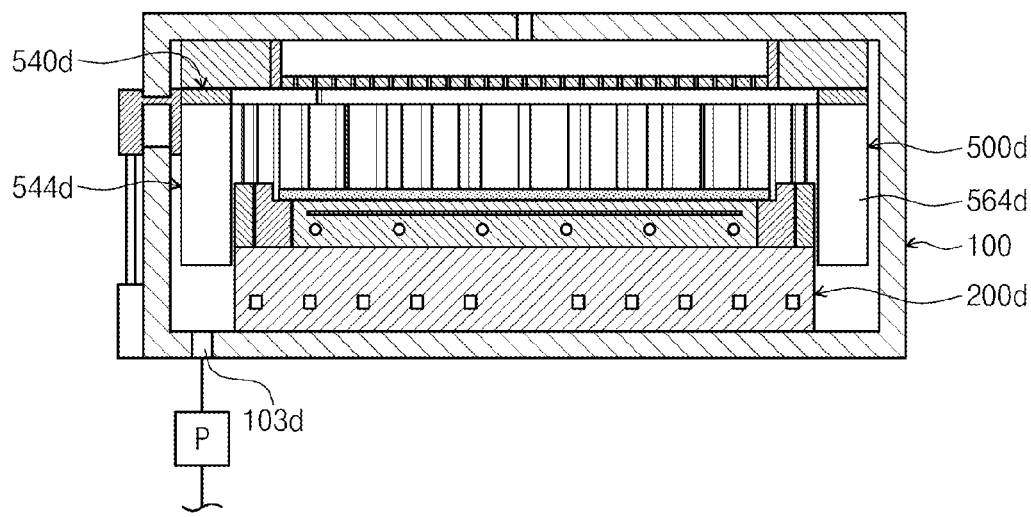
FIGS. 12 to 22 are views of a plasma boundary limiter unit according to another embodiment of the present invention.

A plate 564d in the plasma boundary limiter unit 500d of FIG. 12 may further extend downward than the plate 564 of FIG. 1. A lower end of the plate 564d may be disposed at a height higher than that of a top surface of a support unit 200d. According to an embodiment, in a state where the second body 540d moves downward, the plate 564d of the second body 540d may be disposed at a position adjacent to an exhaust hole 103. When the plasma boundary limiter unit 500d of FIG. 12 is used, the plate 564d is longitudinally provided in a height direction. Thus, a gas flow in the height direction of the plate 564d within a space provided between the plates 564d may interfere to more effectively prevent the plasma from leaking to the outside of the plasma boundary limiter unit 500d.

Figure 13:
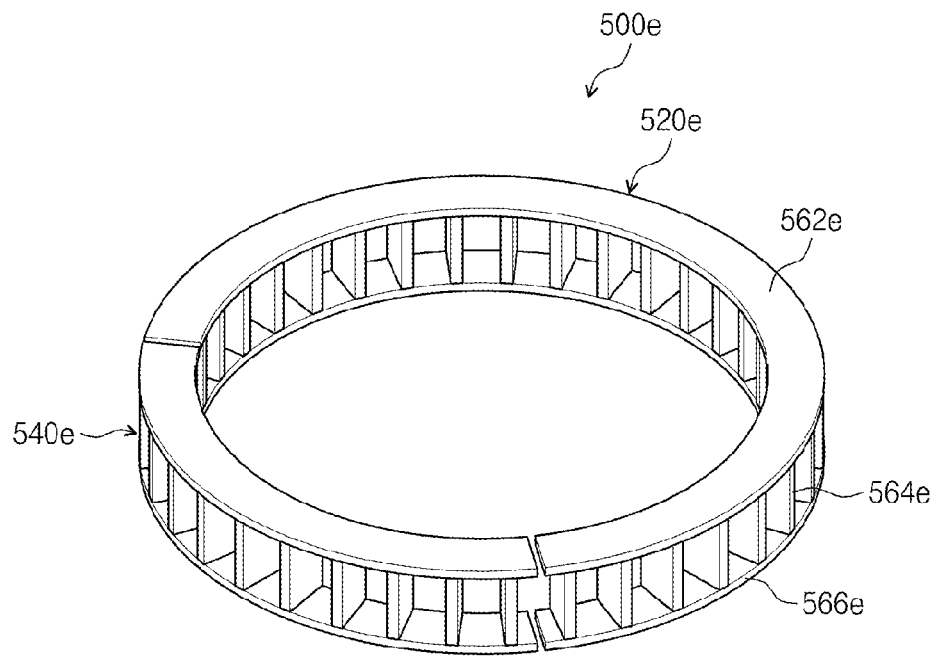

Each of first and second bodies 520e and 540e in the plasma boundary limiter unit 500e of FIG. 13 may include two ring bodies 562e and 566e that vertically face each other. Each of the plates 564e may be disposed between the ring bodies 562e and 566e. In this case, it may efficiently prevent plasma within a discharge space 102 from leaking to the outside of the plasma boundary limiter unit 500e along the height direction of the plate 564e.

Figure 14:
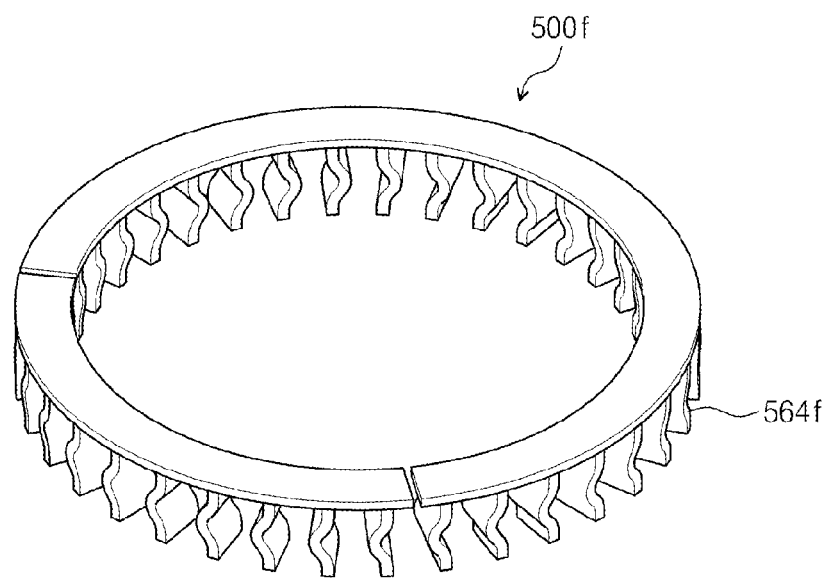

Each of plates 564f in the plasma boundary limiter unit 500f of FIG. 14 has a shape bent in a height direction. In this case, it may efficiently prevent plasma within a discharge space 102 from leaking to the outside of the plasma boundary limiter unit 500f along the height direction of the plate 564f.

Figure 15:
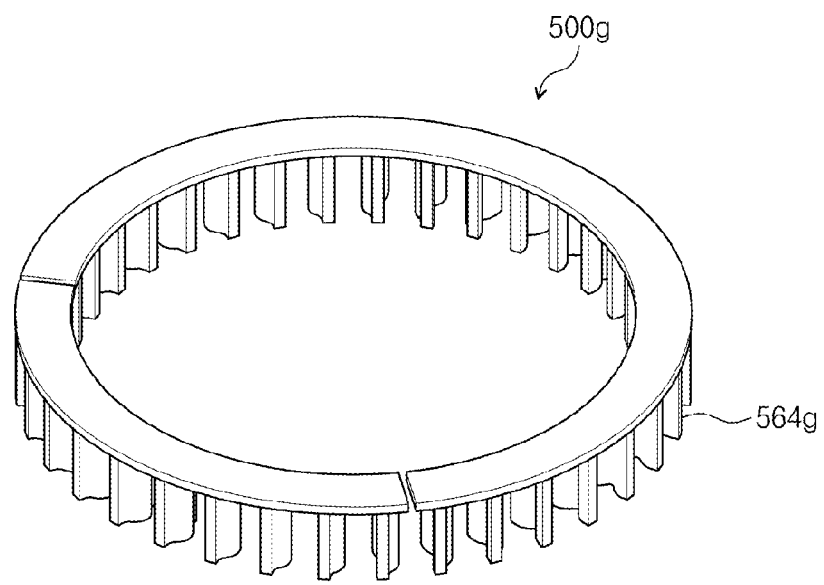

Each of plates 564g in the plasma boundary limiter unit 500g of FIG. 15 has a shape bent in a length direction. In this case, it may efficiently prevent plasma within a discharge space 102 from leaking to the outside of the plasma boundary limiter unit 500g along the length direction of the plate 564g.

Figure 16:
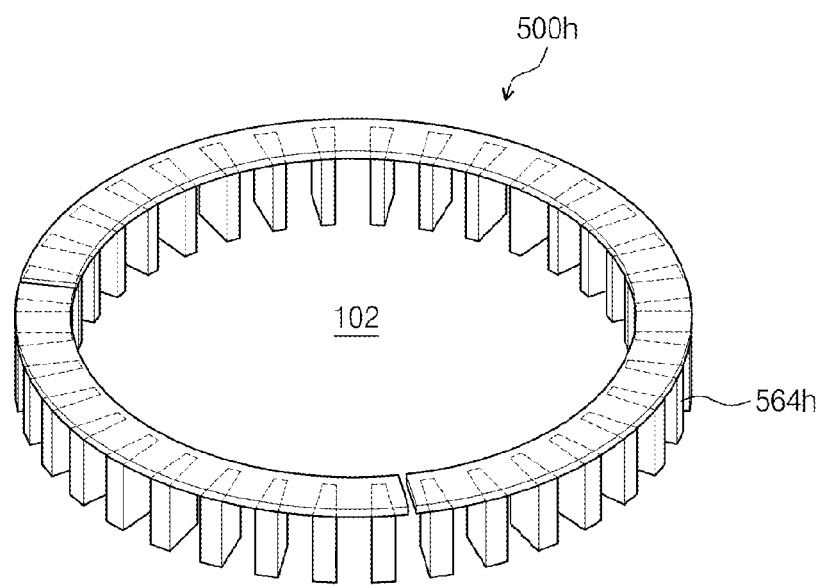

A plate 564h in the plasma boundary limiter unit 500h of FIG. 16 may have a thickness gradually increasing away from a discharge space 102 along a length direction of the plate 564h. Thus, a distance between the adjacent plates 564h may be equal to each other along a radius direction. In this case, it may efficiently prevent plasma within a discharge space 102 from leaking to the outside of the plasma boundary limiter unit 500h along the length direction of the plate 564h when compared to the plasma boundary limiter unit 500 of FIG. 1.

Figure 17:
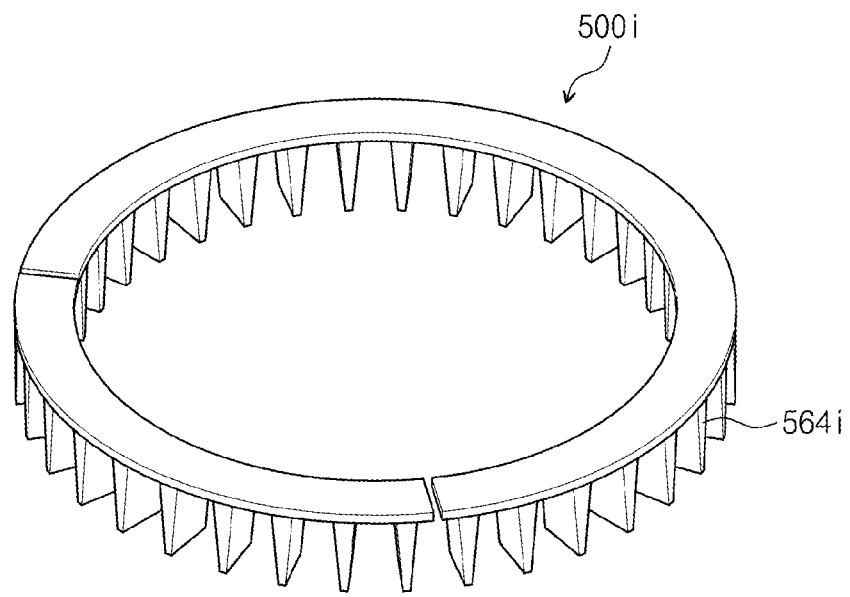
Figure 18:
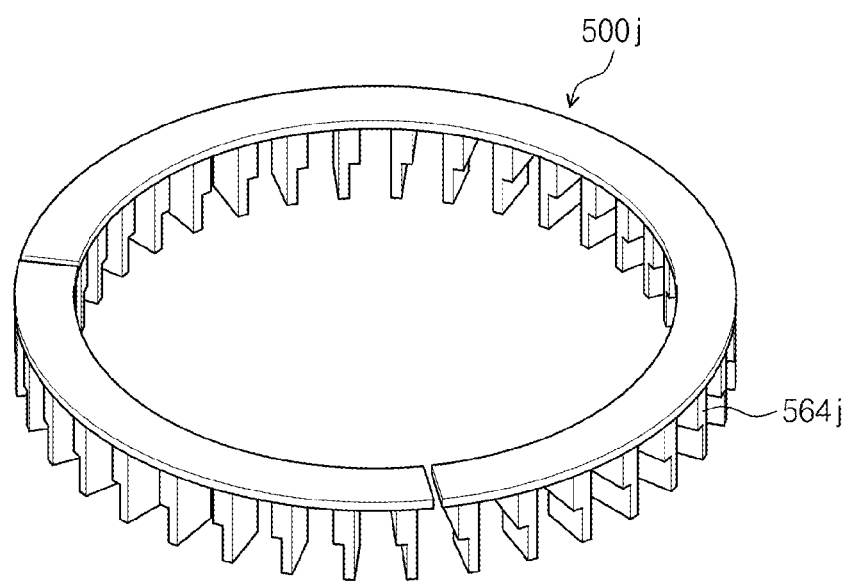

A plate 564i in the plasma boundary limiter unit 500i of FIG. 17 may have a width that is variable according to a height of the plate 564i. Thus, the adjacent plates 564i have vertical distances different from each other. In this case, an amount of a gas exhausted from the discharge space 102 may be adjusted through a region adjacent to the upper electrode (see reference numeral 420 of FIG. 1) and a region adjacent to the lower electrode (see reference numeral 440 of FIG. 1). According to an embodiment, the plate 564i may have a width gradually increasing toward a lower portion thereof to reduce an amount of plasma leaking through an upper region within the discharge space 102. Alternatively, like the plasma boundary limiter unit 500j of FIG. 18, a plate 564j may have a width having a stepped portion and gradually increasing toward a lower portion thereof. When the plasma boundary limiter units 500i and 500j of FIGS. 17 and 18 are used, an etching rate over the entire area of the substrate W may be improved.

Figure 19:
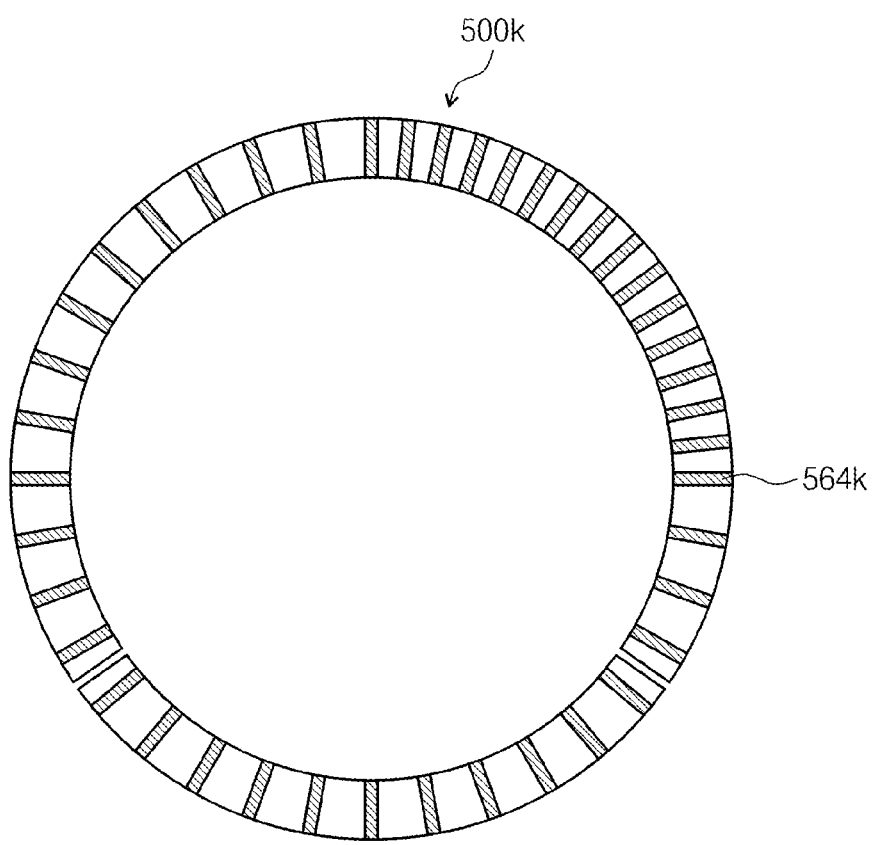

In the plasma boundary limiter unit 500k of FIG. 19, plates 564k may have different distances along a circumferential direction. In this case, an etching rate of the substrate W may be adjusted for each area. An etching rate of the substrate W in a region adjacent to a region in which a distance between the plates 564k is relatively narrow may be greater than that of the substrate W in a region adjacent to a region in which a distance between the plates 564k is relatively wide.

Figure 20:
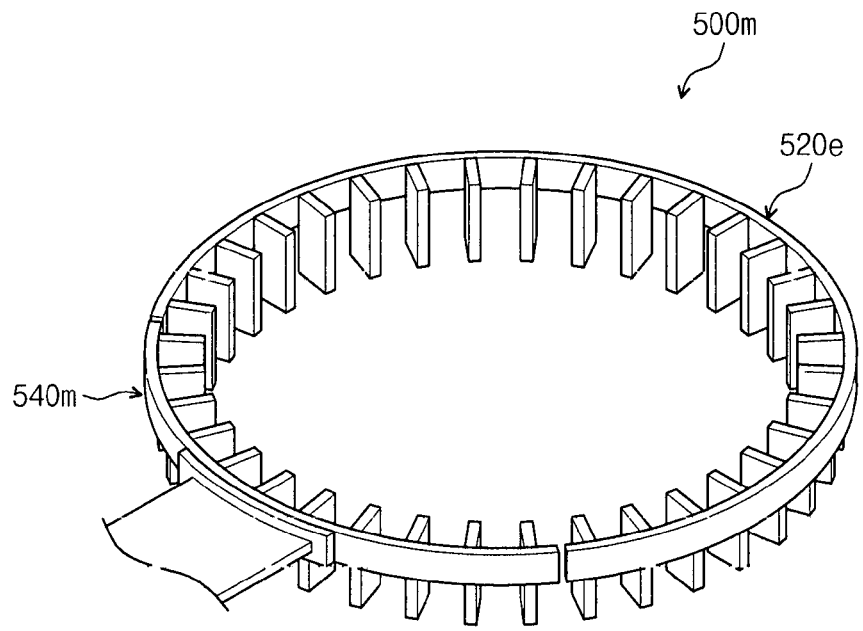

In the plasma boundary limiter unit 500m of FIG. 20, a ring body 520m may be disposed at a position different from that of the ring body 562 of FIG. 1. For example, as shown in FIG. 20, the ring body 520m may be disposed on outer upper ends of plates 540m. Alternatively, the ring body 520m may be disposed on inner upper ends of the plates 540m.

Figure 21:
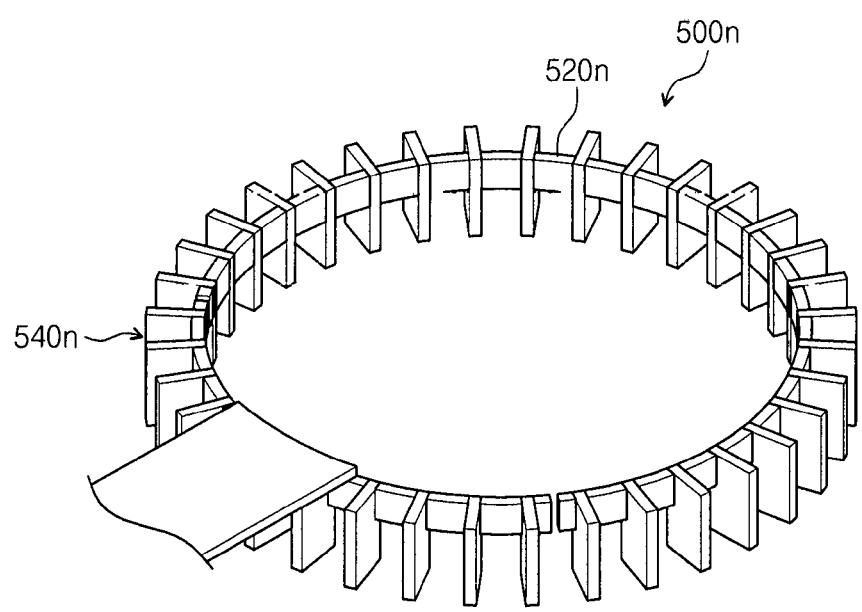

In the plasma boundary limiter unit 500n of FIG. 21, a coupling member for coupling plates 540n to each other may be provided as a separate part in addition to a ring body. For example, the coupling member may be provided as a plurality of connection rods 520n connecting plates 540n to each other. Each of the connection rods 520n may be disposed between the plates 540n and coupled to upper ends of the adjacent plates 540n.

Figure 22:
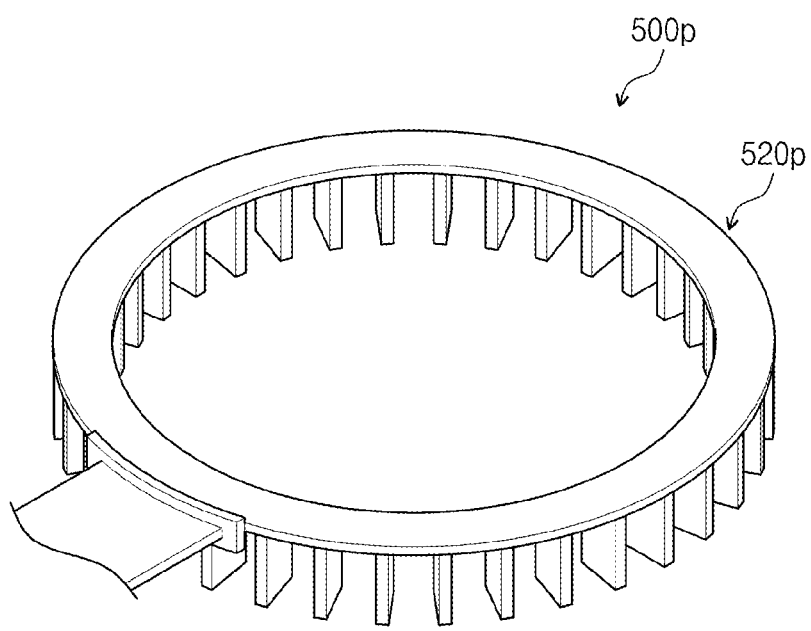

FIG. 22 is a view of a plasma boundary limiter unit 500p according to further another embodiment. In the foregoing embodiments, the ring body of the plasma boundary limiter unit includes the first and second bodies which are separable from each other. However, as shown in the plasma boundary limiter unit 500p of FIG. 22, a ring body 520p may be integrally provided. In this case, the whole plasma boundary limiter unit 500p may move in a vertical direction. As shown in FIG. 1, the plasma boundary limiter unit 500p may vertically move together with a door assembly by a door driver because the ring body 520p is coupled to the door assembly. Alternatively, as shown in FIG. 11, the plasma boundary may vertically move by a driver that is provided independent from the door assembly.

According to the embodiments of the present invention, the plasma boundary limiter unit may be divided into the first body and the second body, and the first body may be coupled to the door. Thus, since the first body vertically moves together with the door, the number of parts for moving the first body may be reduced.

Also, according to the embodiments of the present invention, the number of processes and a time required when the substrate is loaded into or unloaded from the process chamber may be reduced.

Also, according to the embodiments of the present invention, the plasma boundary limiter unit may be divided into the first body and the second body, and only the second body moves when the substrate is loaded or unloaded. Thus, a load applied when the second body moves in the vertical direction may be reduced.

Also, according to the embodiments of the present invention, since the plurality of plates are provided along the length direction of the ring body, a gas within the discharge space may be smoothly exhausted.

Also, according to the embodiments of the present invention, the etching rate over the entire area of the substrate may be improved according to the arrangements and shapes of the plates, or the etching rate of the substrate may be adjusted for each area of the substrate.

The above-disclosed subject matter is to be considered illustrative, and not restrictive, and the appended claims are intended to cover all such modifications, enhancements, and other embodiments, which fall within the true spirit and scope of the present invention. The preferred embodiments should be considered in descriptive sense only and not for purposes of limitation. Therefore, the scope of the invention is defined not by the detailed description of the invention but by the appended claims, and all differences within the scope will be construed as being included in the present invention.

What is claimed is:

1. An apparatus for treating a substrate, the apparatus comprising:
   a process chamber having an opening through which the substrate is loaded or unloaded, the process chamber including a door assembly adjacent to the opening, the door assembly including an outer door and an inner door:
   a support within the process chamber configured to support the substrate; a gas supply configured to supply a process gas into the process chamber; a plasma generator configured to generate plasma from the process gas; and a plasma boundary limiter within the process chamber configured to surround a discharge space defined above the support, the plasma boundary limiter configured to reduce the plasma from leaking from the discharge space, the plasma boundary limiter including,
   a plurality of plates along a circumference of the discharge space, the plurality of plates being spaced apart from each other along the circumference of the discharge space so that a gas within the discharge space flows outside of the discharge space through passages provided between adjacent ones of the plurality of plates, and a coupling member configured to couple the plurality of plates with each other, the coupling member having a first body that is fixedly coupled to the door.

2. The apparatus of claim 1, wherein the coupling member is a ring body.

3. The apparatus of claim 2, wherein the ring body is on upper ends of the plates.

4. The apparatus of claim 2, wherein the ring body further comprises:
   a second body combined with the first body to form a ring shape, wherein
   the first body is vertically movable with respect to the second body within the process chamber.

5. The apparatus of claim 1, wherein each of the plurality of plates have the same distance therebetween.

6. The apparatus of claim 1, wherein the plurality of plates have different thicknesses in a vertical direction so that the passages have different widths in the vertical direction.

7. The apparatus of claim 6, wherein each of the passages has a lower width less than an upper width thereof.

8. The apparatus of claim 4, wherein the first body and the second body are combined with each other to form a circular ring shape, and
   a length of a side parallel to a radius direction of the ring body of each of the plurality of plates is longer than that of a width side of the ring body.

9. The apparatus of claim 4, wherein the first body and the second body are combined with each other to form a circular ring shape, and
   the plurality of plates have the same width in a length direction thereof so that a distance between the plurality of plates along a radius direction of the ring body is gradually widened toward the outside of the discharge space.

10. The apparatus of claim 4, wherein the first body and the second body are combined with each other to form a circular ring shape, and
    each of the plurality of plates has a width gradually increasing in a length direction thereof toward the outside of the discharge space so that the plurality of plates along a radius direction of the ring body have the same distance therebetween.

11. The apparatus of claim 2, wherein the plurality of plates along a length direction of the ring body have different distances therebetween.

12. The apparatus of claim 1, wherein lower ends of the plurality of plates are adjacent to an upper end of the support.

13. The apparatus of claim 1, wherein lower ends of the plurality of plates are under an upper end of the support.

14. The apparatus of claim 1, wherein each of the plurality of plates is bent in a direction away from the discharge space.

15. The apparatus of claim 1, wherein each of the plurality of plates is vertically bent.

16. The apparatus of claim 1, wherein
    the outer door is outside the process chamber,
    the inner door is inside the process chamber facing the outer door, the inner door being coupled to the coupling member, and
    the door assembly further includes a connection plate connecting the outer door to the inner door.

17. The apparatus of claim 1, wherein the plasma boundary limiter is formed of a conductive material, and
    the plasma boundary limiter is in contact with an upper electrode so that the plasma boundary limiter is electrically connected to the upper electrode.

18. A plasma boundary limiter configured to reduce leakage of plasma outside of a discharge space associated with an apparatus for treating a substrate using the plasma, the plasma boundary limiter comprising:
    a plurality of plates; and
    a coupling member configured to couple the plurality of plates with each other such that the plates are arranged along a circumference of the coupling member, the coupling member having a first body that is configured to be fixedly coupled to a door assembly of the apparatus for allowing the door assembly and the first body to be vertically driven together, the door assembly including an outer door and an inner door, the door driver configured to move the outer door and the plasma boundary limiter, wherein the plurality of plates are spaced apart from each other along the circumference of the coupling member for allowing a gas to flow through passages provided between adjacent ones of the plurality of plates.

19. The plasma boundary limiter of claim 18, wherein the coupling member is a ring body, and the plurality of plates are coupled to the ring body.

20. The plasma boundary limiter of claim 18, wherein the ring body further comprises:

a second body combined with the first body to form a ring shape, wherein the first body is vertically movable with respect to the second body within the process chamber.

21. The plasma boundary limiter of claim 19, wherein a length of a side parallel to a radius direction of the ring body of each of the plurality of plates is longer than that of a width side of the ring body when viewed from an upper side.

22. The plasma boundary limiter of claim 18, wherein the plurality of plates have different thicknesses in a vertical direction so that the passages have different widths in the vertical direction.

23. The plasma boundary limiter of claim 20, wherein the plurality of plates along a length direction of the ring body have different distances therebetween.

24. The apparatus of claim 1, wherein the first body is directly connected to the door assembly such that the door driver is configured to adjust the position of the plasma boundary limiter.

* * * * *